United States Patent
Velandia (10) Patent No.: US 7,326,973 B2
(45) Date of Patent: Feb. 5, 2008

(54) METHOD AND AN APPARATUS FOR A HARD-CODED BIT VALUE CHANGEABLE IN ANY LAYER OF METAL

(75) Inventor: Maurice Velandia, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 364 days.

(21) Appl. No.: 11/049,435

(22) Filed: Feb. 1, 2005

(65) Prior Publication Data

US 2005/0127506 A1 Jun. 16, 2005

Related U.S. Application Data

(62) Division of application No. 10/454,312, filed on Jun. 3, 2003, now abandoned.

(51) Int. Cl.
*H01L 27/118* (2006.01)

(52) U.S. Cl. .............................. 257/211; 257/E23.179; 257/734; 257/758; 257/209; 438/622; 326/47

(58) Field of Classification Search ........ 257/E23.179, 257/758, 208, 209, 211, 390, E27.077, E21.66, 257/E21.678, E21.683, 734, 202; 438/622; 326/47

See application file for complete search history.

(56) References Cited

U.S. PATENT DOCUMENTS

| | | | |
|---|---|---|---|
| 5,907,167 A * | 5/1999 | Levin | 257/208 |
| 6,496,035 B2 | 12/2002 | Jensen et al. | |
| 6,771,533 B2 * | 8/2004 | Witcraft et al. | 365/158 |
| 6,779,069 B1 | 8/2004 | Treichler et al. | |
| 7,064,579 B2 * | 6/2006 | Madurawe | 326/39 |
| 2003/0210251 A1 | 11/2003 | Brown | |

* cited by examiner

*Primary Examiner*—Kenneth Parker
*Assistant Examiner*—Chris C. Chu
(74) *Attorney, Agent, or Firm*—Blakely, Sokoloff, Taylor & Zafman LLP (57) ABSTRACT

A method is disclosed to make a hard-coded bit in an integrated circuit on a semiconductor chip changeable in any one and only one metal layer of the semiconductor chip. In one embodiment, the method further comprising fabricating a cell on each metal layer of the semiconductor chip and a logic circuitry on the semiconductor chip. The cells are coupled to the inputs of the logic circuitry. The output of the logic circuitry changes in response to a change in any single cell to cause the hard-coded bit to change.

4 Claims, 8 Drawing Sheets

METHOD AND AN APPARATUS FOR A HARD-CODED BIT VALUE CHANGEABLE IN ANY LAYER OF METAL

The present patent application is a divisional application of prior application Ser. No. 10/454,312 filed Jun. 3, 2003, now abandoned.

FIELD OF INVENTION

The present disclosure relates to the fabrication of semiconductor chips, and more particularly, to changing the value of a hard-coded bit on a semiconductor chip during fabrication.

BACKGROUND

Integrated electronic circuits fabricated on a semiconductor chip typically include a number of hard-coded bits for various purposes. For example, a revision identifier on a semiconductor chip includes a number of hard-coded bits to indicate which stepping of the mask is used to fabricate the chip. A new stepping of the mask is created every time the layout of the semiconductor chip is changed, and a distinct revision identifier, also known as a stepping ID, is assigned to each stepping. Typical examples of revision identifier include "A0," "A1," "B1," or "B2," etc.

The layout of an integrated circuit is changed when a functional change is made in the integrated circuit. Changing the layout requires creating a new stepping. Consequently, the revision identifier has to be changed as well when a functional change is made in the integrated circuit.

Currently, there are two methods to implement a hard-coded bit value in a semiconductor chip. The first method implements the hard-coded bit value as a part of the register transistor level ("RTL") code. Since the hard-coded bit value is generated by the RTL code, the bit is not associated with one and only one metal layer. Therefore, multiple metal layers are modified to change the bit.

Figure 1A:
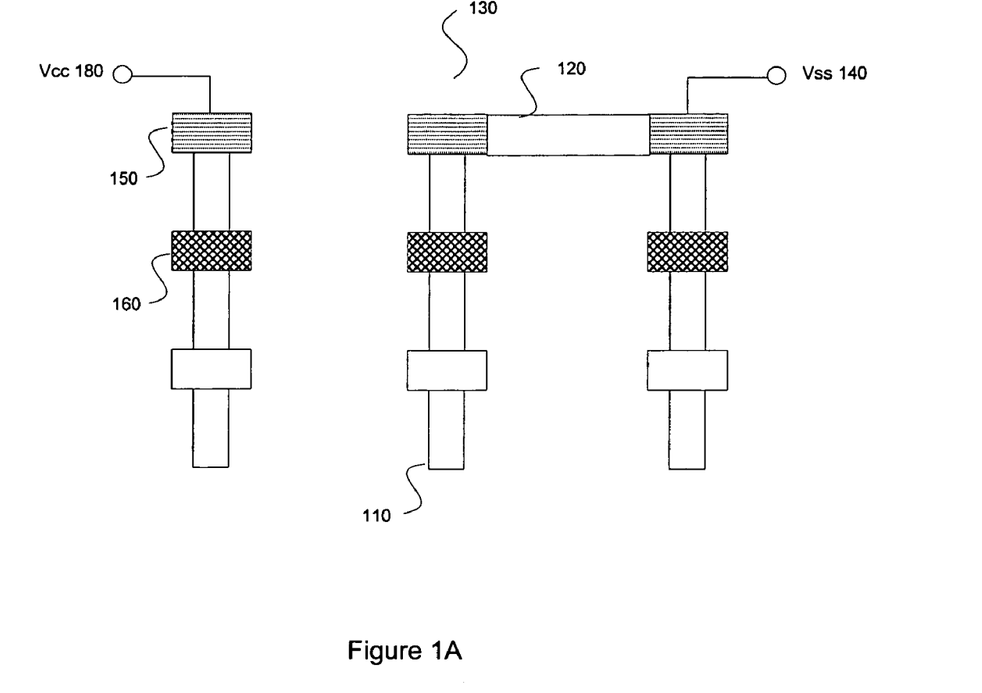
FIG. 1A shows a hard-coded bit set at logic 0 implemented with a metal structure.

The second method to implement a hard-coded bit value in a semiconductor chip is to fabricate a custom-built metal structure on the semiconductor chip to couple Vss or Vcc to the hard-coded bit. FIG. 1A shows a metal structure 130 on a semiconductor chip (not shown) with a hard-coded bit 110 at one end of the metal structure 130. The hard-coded bit 110 is coupled to Vss 140 via a connection 120 in between the metal structure 130 and Vss 140, and therefore, the hard-coded bit 110 is set to logic 0. Changing the metal layers of the semiconductor chip changes the metal structure to cause a change in the hard-coded bit. However, once a connection is created in a metal layer, subsequent changes of the metal structure requires cutting off the connection regardless of whether the functional change is in the same metal layer as the connection is in. In other words, two or more metal layers have to be changed in order to change the hard-coded bit.

Figure 1B:
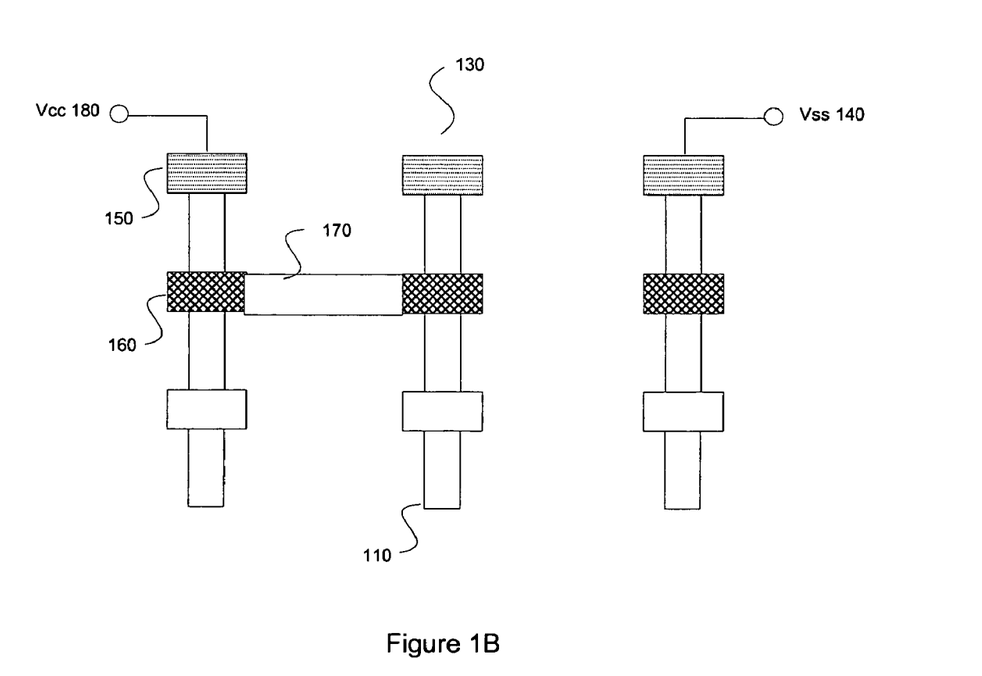
FIG. 1B shows a hard-coded bit set at logic 1 implemented with a metal structure.

Suppose the functional change in the new stepping requires changing only the metal layer 160. The new stepping also needs a new revision identifier. Therefore, the hard-coded bit 110 on the metal structure 130 has to be changed. Referring to FIG. 1B, the metal layer 150 is changed to remove the connection 120 in order to cut off the metal structure 130 from Vss 140. In addition, a connection 170 is fabricated in metal layer 160 to couple the metal structure 130 to the Vcc 180 to change the hard-coded bit from logic 0 to logic 1. It is necessary to remove the connection 120 in the metal layer 150 to allow a change in the hard-coded bit 110 on the metal structure 130 regardless of which metal layer is changed to implement the functional change in the new stepping. As a result, two metal layers are changed even though the functional change requires changing only one metal layer.

As explained above, the change of the revision identifier associated with a new stepping is not necessarily in the same metal layer as the functional change in the integrated circuit using the current methods. Frequently, changing the revision identifier requires changing more metal layers than the functional change requires. Changing a metal layer typically costs $10,000. As a result, the more metal layers are changed in a stepping, the more expensive the stepping is.

BRIEF DESCRIPTION OF THE DRAWINGS

Embodiments of the present invention will be understood more fully from the detailed description that follows and from the accompanying drawings, which however, should not be taken to limit the appended claims to the specific embodiments shown, but are for explanation and understanding only.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Figure 2A:
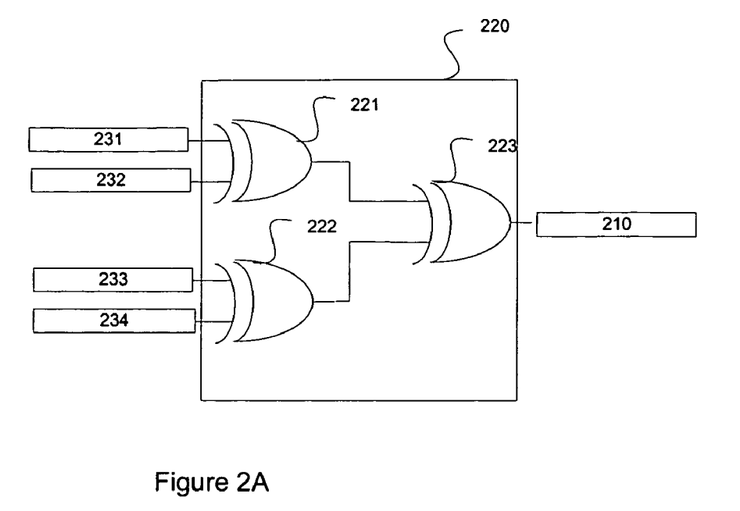
FIG. 2A shows one embodiment of a hard-coded bit implemented with four tieoff cells and a logic circuitry.

FIG. 2A shows an embodiment that implements a hard-coded bit 210. The hard-coded bit 210 is generated by a logic circuitry 220 fabricated on a semiconductor chip (not shown). The semiconductor chip has a number of tieoff cells 231-234. In addition to tieoff cells, other types of cells or structures that can be set to either logic 1 or logic 0 can be used. At least one tieoff cell is fabricated on each metal layer of the semiconductor chip. For example, the embodiment shown in FIG. 2A has four metal layers, and the tieoff cell 231 is from the first metal layer, the tieoff cell 232 is from the second metal layer, and so on. The tieoff cells 231-234 are coupled to the inputs of the logic circuitry 220.

In an alternate embodiment, two cells are provided for each metal layer. For example, referring to FIG. 2C, the cells M1L0 281 and M1L1 282 are provided for the metal layer M1. Cell 281 is hard-wired to logic 0 and cell 282 is hard-wired to logic 1. Cell 281 is coupled to the metal layer M1 287 via the connection 285 and cell 282 is isolated from the metal layer 287. The metal layer 287 is coupled to one of the inputs of the logic circuitry (not shown). Therefore, an input of logic 0 is provided via the metal layer 287 to the logic circuitry. Similarly, cell 283 is hard-wired to logic 0 and cell 284 is hard-wired to logic 1. Cell 284 is coupled to the metal layer M2 288 via the connection 286. The metal layer 288 is coupled to the input of the logic circuitry (not shown), providing an input of logic 1 to the logic circuitry.

Referring to FIG. 2A, the output of the logic circuitry 220 is the hard-coded bit 210. In another embodiment, the output of the logic circuitry 220 is coupled to the hard-coded bit via additional circuit components to cause the hard-coded bit to change in response to the output of the logic circuitry 220.

The logic circuitry 220 is configured such that changing any single tieoff cell of the tieoff cells 231-234 changes the output of the logic circuitry 220 regardless of the initial values of the tieoff cells 231-234. Changing one tieoff cell requires changing only one metal layer, which is the metal layer the tieoff cell is on. Therefore, the hard-coded bit is changeable by changing any single metal layer. Moreover, the hard-coded bit can be changed again later in another stepping without undoing the change made to a tieoff cell in an earlier stepping. In one embodiment, the functional change in a stepping requires changing more than one metal layer, say X metal layers. To change the hard-coded bit in the stepping, any one tieoff cell chosen from the X tieoff cells on the X metal layers can be changed.

In one embodiment, the logic circuitry 220 includes an exclusive OR ("XOR") circuit. The output of the XOR circuit changes when any single input signal changes. Referring to FIG. 2A, the embodiment of the logic circuitry 220 shown includes an XOR circuitry made up of three 2-input XOR gates 221-223. The tieoff cell 231 and the tieoff cell 232 are input to the XOR gate 221, and the tieoff cell 233 and the tieoff cell 234 are input to the XOR gate 222. The outputs of both XOR gates 221 and 222 are input to the XOR gate 223. The output of the XOR gate 223 is the output of the logic circuitry 220. The output of the XOR gate 223 changes in response to a change in any one of the tieoff cells 231-234. Suppose all four tieoff cells 231-234 are at logic 0 initially. Then the output signals of both XOR gates 221 and 222 are at logic 0, which are input to the XOR gate 223. Since both input signals to the XOR gate 223 are at logic 0, the XOR gate 223 generates an output at logic 0. Since the hard-coded bit 210 is the output of the XOR gate 223 in the embodiment shown in FIG. 2A, the hard-coded bit 210 is at logic 0.

To change the hard-coded bit 210 to logic 1, any one of the tieoff cells 231-234 can be changed. For example, suppose the tieoff cell 231 is changed from logic 0 to logic 1, while the other tieoff cells 232-234 remain at logic 0. The output of the XOR gate 221 is therefore changed from logic 0 to logic 1. Since the tieoff cells 233 and 234 remain at logic 0, the output of the XOR gate 222 remains at logic 0. The outputs of the XOR gate 221 and the XOR gate 222 are input to the XOR gate 223, that is, a logic 0 and a logic 1 are input to the XOR gate 223. The input of a logic 0 and a logic 1 causes the output of the XOR gate 223 to change from logic 0 to logic 1. The hard-coded bit 210 is the output of the XOR gate 223 in the embodiment shown in FIG. 2A, and therefore, the hard-coded bit 210 is changed from logic 0 to logic 1. One should appreciate that any one of the tieoff cells 231-234 can be changed to change the output of the XOR gate 223 regardless of the initial values of the tieoff cells. Moreover, when the output of the XOR gate 223 has to be changed again, it is not necessary to undo the earlier change made to the tieoff cell 231 because the output of the XOR gate 223 changes as long as any one of the tieoff cells 231-234 is changed regardless of the initial state of the tieoff cells 231-234.

Figure 2B:
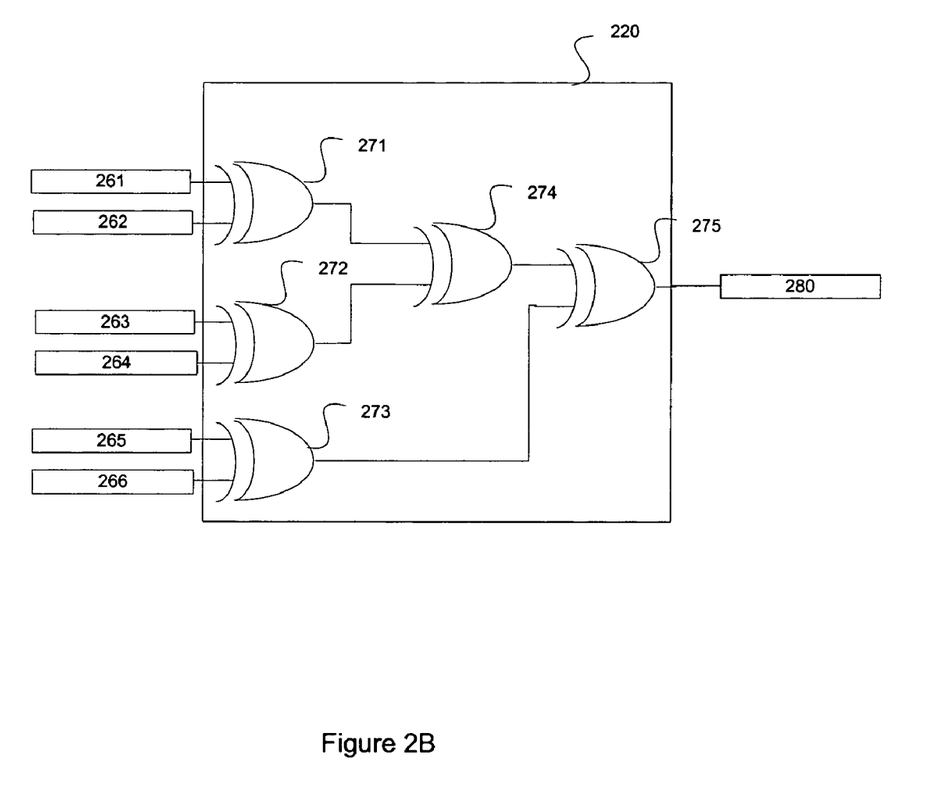
FIG. 2B shows another embodiment of a hard-coded bit implemented with six tieoff cells and a logic circuitry.
Figure 2C:
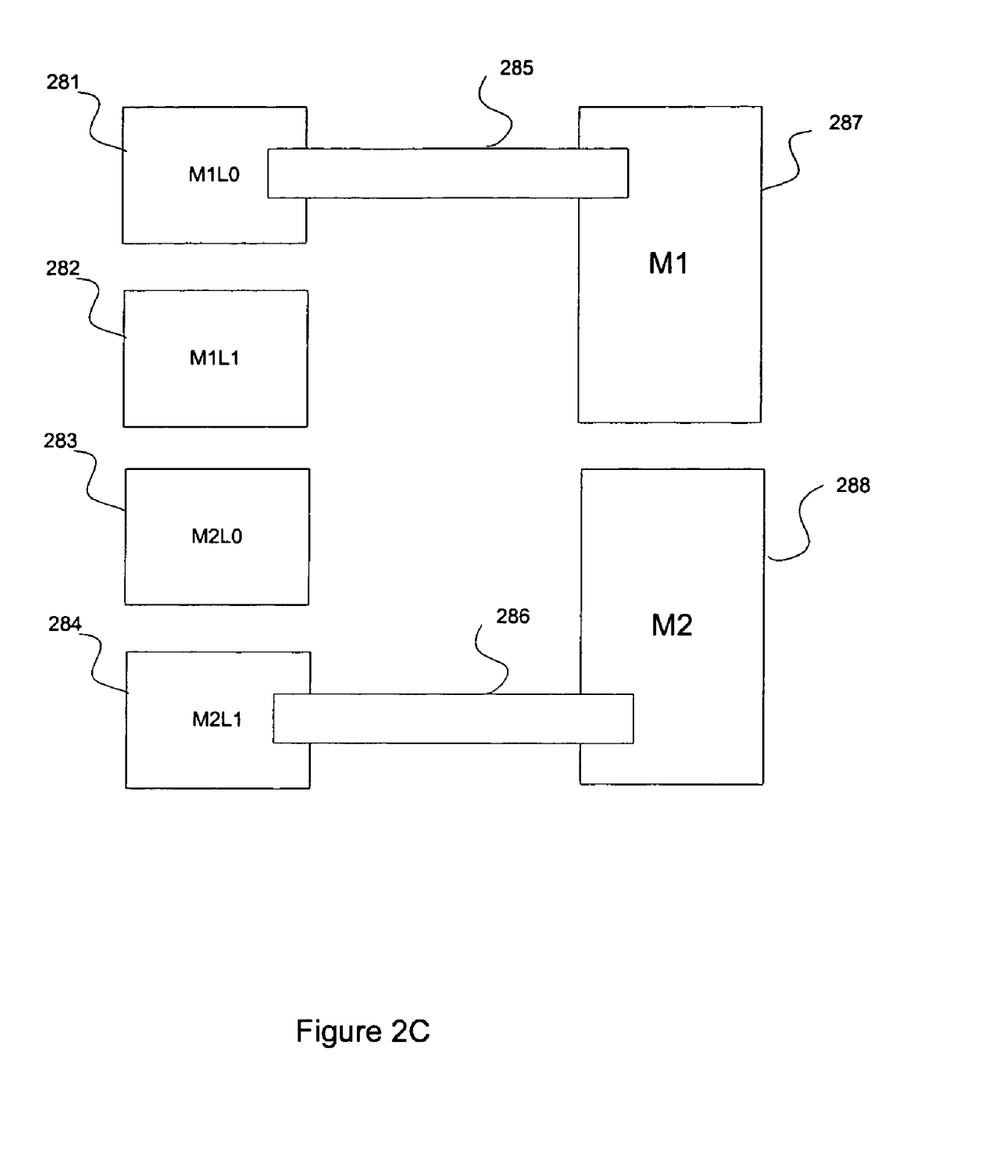
FIG. 2C shows an embodiment of hard-wired cells coupled to metal layers.

To implement a semiconductor chip with the hard-coded bit using additional metal layers, additional logic gates are added to the logic circuitry 220. FIG. 2B shows one embodiment of a semiconductor chip with a hard-coded bit and six metal layers. Each of the metal layers (not shown) has a tieoff cell. For example, the tieoff cell 261 is on the first metal layer, the tieoff cell 262 is on the second metal layer, and so on. The tieoff cells 261 and 262 are input to the XOR gate 271. The tieoff cells 263 and 264 are input to the XOR gate 272. The tieoff cells 265 and 266 are input to the XOR gate 273. The outputs of the XOR gates 271 and 272 are input to the XOR gate 274. The output of the XOR gate 274 and the output of the XOR gate 273 are input to the XOR gate 275. In one embodiment the output 280 of the XOR gate 275 is the hard-coded bit 210. In another embodiment, the output 280 of the XOR gate 275 is coupled to the hard-coded bit to cause the hard-coded bit to change in response to the output of the XOR gate 275.

Changing any single tieoff cell of the tieoff cells 261-266 will change the output of the XOR gate 275, causing a change in the hard-coded bit 280. For example, suppose the tieoff cells 261-266 are all at logic 0 initially. Then the outputs of the XOR gates 271-275 are all at logic 0. When only the tieoff cell 261 is changed from logic 0 to logic 1, the output of the XOR gate 271 changes from logic 0 to logic 1. The output of the XOR gate 271 is input to the XOR gate 274, causing the output of the XOR gate 274 to change from logic 0 to logic 1. The output of the XOR gate 274 is input to the XOR gate 275, causing the output of the XOR gate 275 to change from logic 0 to logic 1. Since the output 280 of the XOR gate 275 is the hard-coded bit 280 in the embodiment shown in FIG. 2B, the hard-coded bit 280 is changed from logic 0 to logic 1.

One should appreciate that the above embodiments of the logic circuitry 220 are provided for the purpose of illustration only. The implementation of the logic circuitry 220 is not limited to XOR gates or XOR logic circuitries. Other combinations of logic circuitries are used in other embodiments to allow the hard-coded bit to be changed by modifying the tieoff cell on any single metal layer.

Figure 2D:
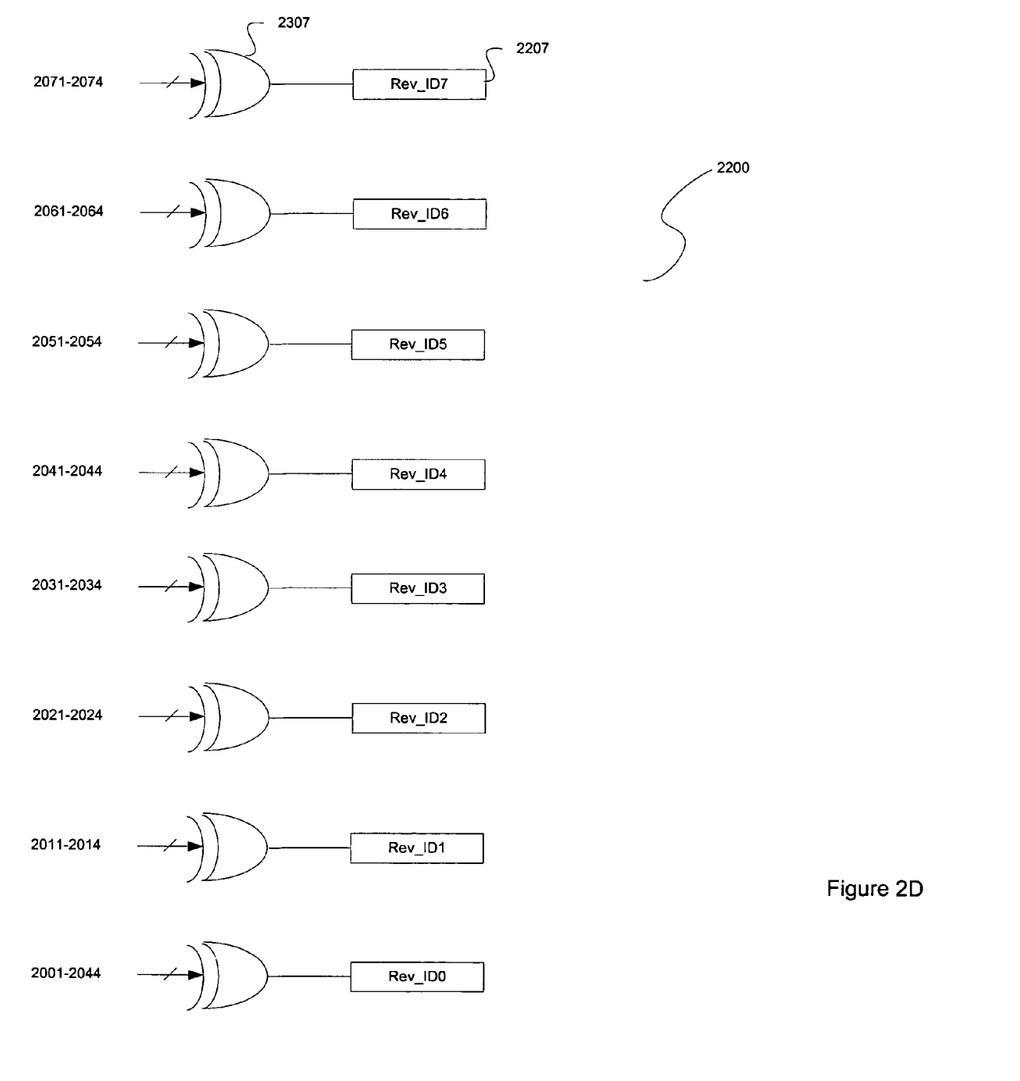
FIG. 2D shows an embodiment of a revision identifier.

In one embodiment, the hard-coded bit is part of a revision identifier 2200 of the semiconductor chip. FIG. 2D shows an embodiment of an eight-bit revision identifier. Referring to FIG. 2D, the revision identifier 2200 has 8 bits, Rev_ID7-Rev_ID0. Other embodiments of the revision identifier have different number of bits, such as, 4, 16, etc. The semiconductor chip has 4 metal layers (not shown), each metal layer having 8 tieoff cells. For example, the first metal layer has the tieoff cells 2001, 2011, 2021, 2031, 2041, 2051, 2061, and 2071. There are a total of 32 tieoff cells 2001-2004, 2011-2014, 2021-2024, 2031-2034, 2041-2044, 2051-2054, 2061-2064, and 2071-2074. Four tieoff cells, one from each metal layer, are input to an XOR gate. There are eight XOR gates on the semiconductor chip. Each XOR gate is coupled to a bit of the revision identifier 2200 to cause the bit to change in response to a change in one of the input tieoff cells. For example, the eighth bit of the revision identifier 2200, Rev_ID7 2207 is coupled to the output of the XOR gate 2307 and the tieoff cells 2071-2074 are input to the XOR gate 2307. A change in any one of the tieoff cells 2071-2074 causes the output of the XOR gate 2307 to change, and consequently, causes Rev_ID7 2207 to change.

As explained above, the revision identifier changes with every stepping. In one embodiment, a new stepping is required due to a functional change implemented as a change on only one metal layer of the semiconductor chip. Since the hard-coded bits of the revision identifier can be changed in any metal layer, it is advantageous to change the hard-coded bits of the revision identifier on the same metal layer as the functional change to reduce the number of metal layers changed. Reducing the number of metal layers changed reduces the cost of the stepping. 1

In another embodiment, the hard-coded bit is a feature selection bit in an integrated circuit. The integrated circuit has a number of operating modes, which are selectable during the fabrication of the integrated circuit using the feature selection bit. In one embodiment, the feature selection bit can be set at logic 1 or logic 0 to enable or disable one or more of the operating modes. To change the feature selection bit in a stepping, a tieoff cell on any single metal layer is switched to the opposite logic value.

Figure 2E:
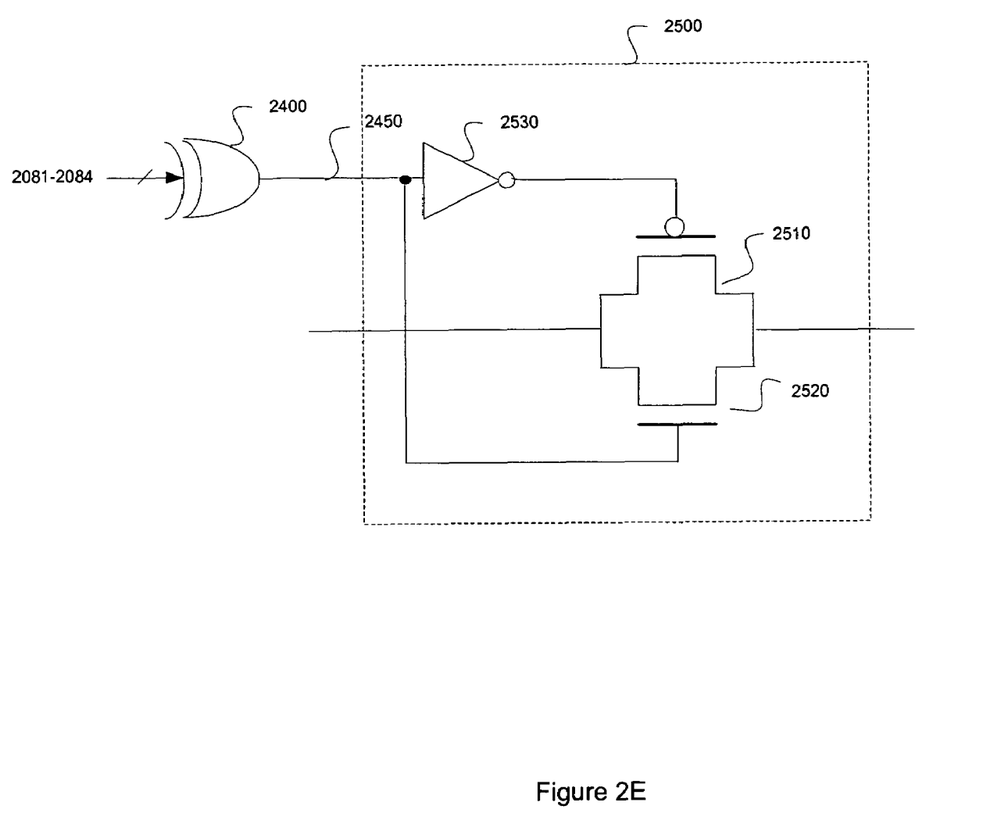
FIG. 2E shows an embodiment of a feature selection bit.

FIG. 2E shows one embodiment of a feature selection bit on a semiconductor chip. There are four tieoff cells 2081-2084, each on a distinct metal layer of the semiconductor chip. The tieoff cells 2081-2084 are input to the XOR gate 2400, which outputs the feature selection bit 2450. The feature selection bit 2450 opens or closes the switch 2500 to enable or to disable a feature of the semiconductor chip.

Referring to FIG. 2E, an embodiment of the switch 2500 includes a p-type Metal Oxide Semiconductor transistor ("pMOS") 2510, an n-type Metal Oxide Semiconductor transistor ("nMOS") 2520, and an inverter 2530. When the feature selection bit 2450 is at a high voltage, the nMOS 2520 is activated. The inverter 2530 converts the high voltage of the feature selection bit 2450 to a low voltage and applies the low voltage at the gate of the pMOS 2510 to activate the pMOS 2510. Therefore, the feature selection bit 2450 closes the switch 2500. When the feature selection bit 2450 is at a low voltage, it deactivates the nMOS 2520 and the pMOS 2510 to open the switch 2500. One should appreciate that the above embodiments are described for the purpose of illustration only, and they do not limit the applications of the hard-coded bits on a semiconductor chip. The hard-coded bits changeable in any metal layer can be used for purposes beyond the above descriptions.

Figure 3A:
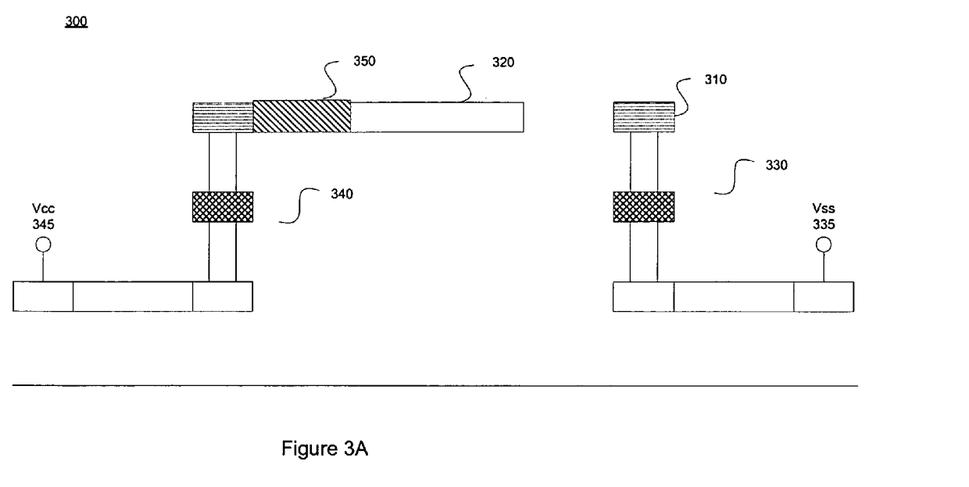
FIG. 3A shows the cross-section of an embodiment of a tieoff cell set at logic 1.

FIG. 3A shows a cross-sectional view of an embodiment of a tieoff cell 300 on a nietal layer 310. The tieoff cell 300 has an output pin 320. There are two via stacks 330 and 340 in the tieoff cell 300. The via stack 330 is coupled to Vss 335. The via stack 340 is coupled to Vcc 345. Coupling the output pin 320 to the via stack 330 couples the output pin 320 to Vss 335. Coupling the output pin 320 to Vss 335 sets the tieoff cell 300 at logic 0. On the contrary, coupling the output pin 320 to the via stack 340 couples the output pin 320 to Vcc 345. Coupling the output pin 320 to Vcc 345 sets the tieoff cell 300 at logic 1. In FIG. 3A, the output pin 320 is coupled to the via stack 340 with a connector 350. The via stack 340 further couples the output pin 320 to Vcc 345, setting the output pin 320 at logic 1.

Figure 3B:
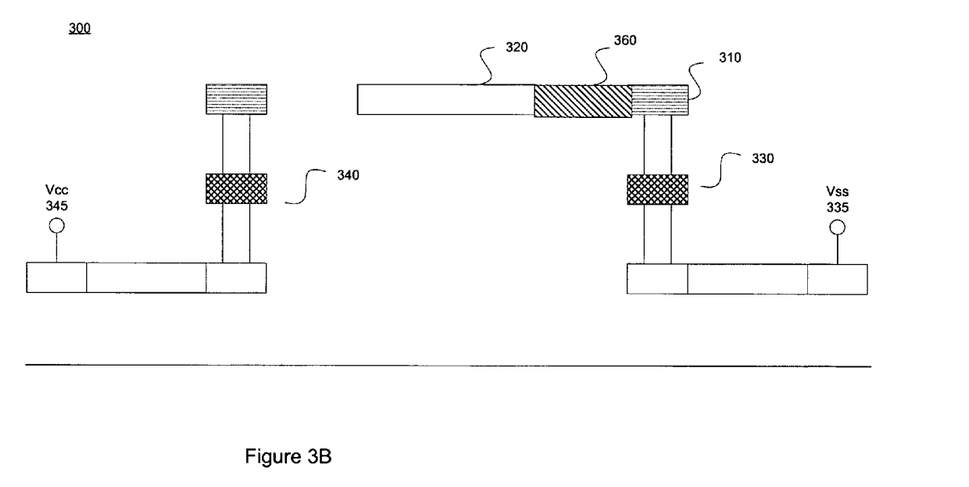
FIG. 3B shows the cross-section of an embodiment of a tieoff cell set at logic 0.

FIG. 3B shows the cross-section of an embodiment of the tieoff cell 300 set at logic 0. The connector 350 has been removed to isolate the output pin 320 from the via stack 340. Therefore, the output pin 320 is not coupled to Vcc 345 in FIG. 3B. A connector 360 is added between the output pin 320 and the via stack 330 to couple the output pin 320 to Vss 335. When the output pin 320 is coupled to Vss 335, the output pin 320 is set at logic 0. In one embodiment, the metal layer 310 is modified to remove the connector 350 and to add the connector 360 to couple the output pin 320 to Vss 335 in order to change the tieoff cell 300 from logic 1 to logic 0. To change the tieoff cell 300 from logic 0 to logic 1, the metal layer 310 is changed to remove the connector 360 and to add the connector 350 to couple the output pin 320 to Vcc 345.

Figure 4A:
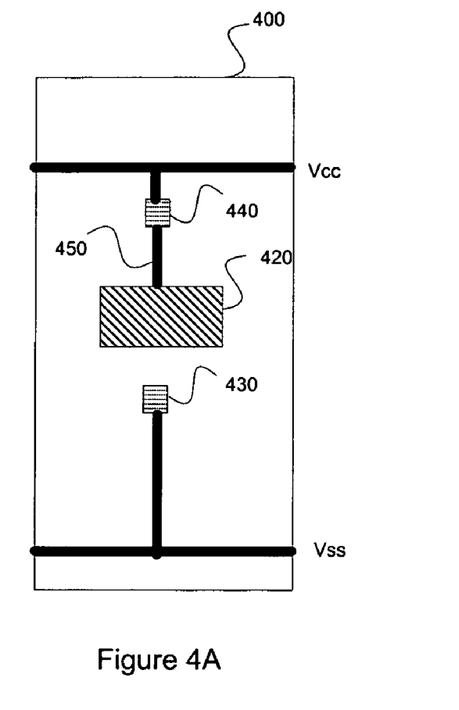
FIG. 4A shows the top view of an embodiment of a tieoff cell set at logic 1.

FIG. 4A shows the top view of an embodiment of a tieoff cell 400 at logic 1. The tieoff cell 400 has an output pin 420 and two via stacks 430 and 440. The via stack 430 is connected to Vss and the via stack 440 is connected to Vcc. The output pin 420 is coupled to the via stack 440 by the connector 450, and therefore, is coupled to Vcc. The output pin 420 is isolated from the via stack 430 so that the output pin 420 is isolated from Vss. Coupling the output pin 420 to Vcc sets the tieoff cell at logic 1.

Figure 4B:
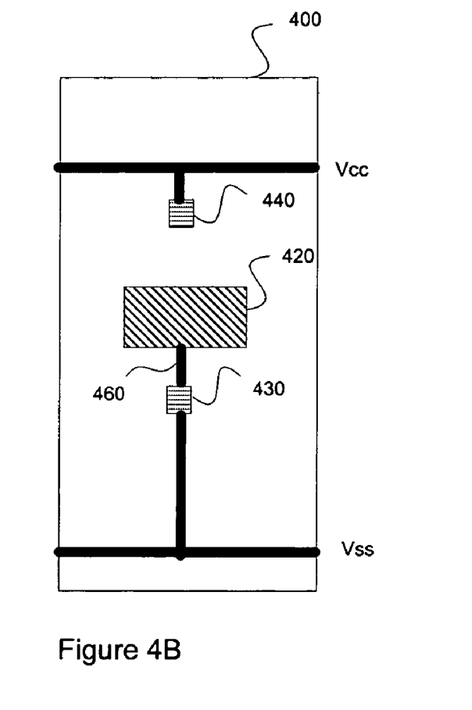
FIG. 4B shows the top view of an embodiment of a tieoff cell set at logic 0.

FIG. 4B shows the top view of an embodiment of the tieoff cell 400 at logic 0. The output pin 420 is coupled to the via stack 430 by the connector 460, which is coupled to Vss. The output pin 420 is isolated from the via stack 440 so that the output pin 420 is isolated from Vcc. Coupling the output pin 420 to Vss sets the tieoff cell at logic 0.

Figure 5:
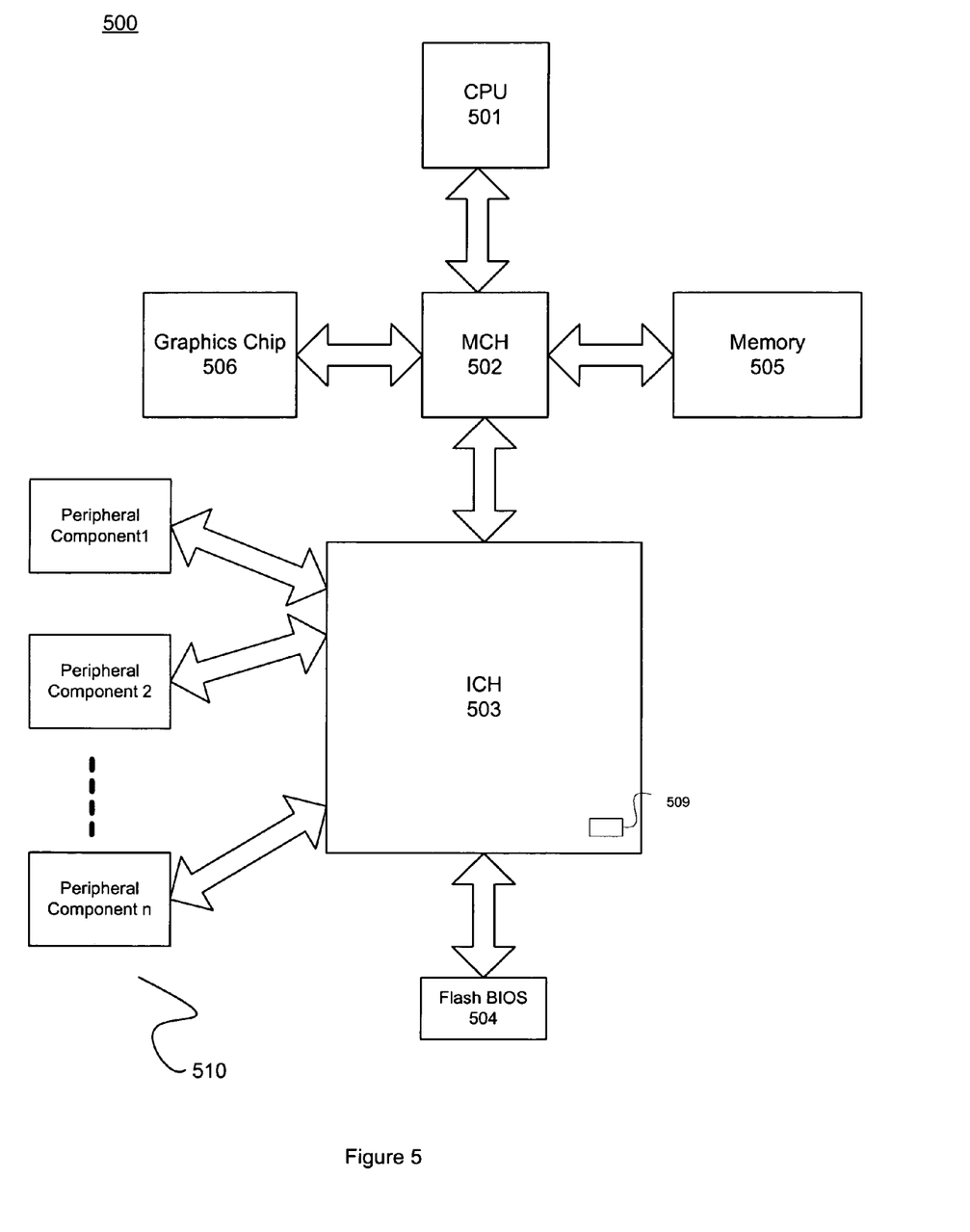
FIG. 5 shows an exemplary embodiment of a computer system.

FIG. 5 is a block diagram of an exemplary computer system. The system 500 includes central processing unit ("CPU") 501, memory controller hub ("MCH") 502, input/output controller hub ("ICH") 503, flash memory device to store the Basic Input Output System ("Flash BIOS") 504, memory 505, graphics chip 506, and a number of peripheral components 510. CPU 501, memory 505, graphics chip 506, and ICH 503 are coupled to MCH 502. Data transmitted between CPU 501, memory device 505, graphics chip 506, and ICH 503 is routed through MCH 502. Peripheral components 510 and flash BIOS 504 are coupled to ICH 503. Peripheral components 510 and flash BIOS 504 communicate with CPU 501, graphics chip 506, and memory 505 through ICH 503 and MCH 502. Note that any or all of the components of system 500 and associated hardware may be used in various embodiments of the present invention. However, it should be appreciated that other configurations of the computer system may include some or all of the devices.

ICH 503 is fabricated on a semiconductor chip. The semiconductor chip has a number of metal layers. ICH 503 includes a hard-coded bit 509 changeable in any single metal layer of the semiconductor chip. The semiconductor chip has a number of tieoff cells. There is at least one tieoff cell fabricated on each metal layer of the semiconductor chip. The tieoff cells are input to a logic circuitry. The logic circuitry is configured such that changing any single tieoff cell changes the output of the logic circuitry. In one embodiment, the output of the logic circuitry is the hard-coded bit. In another embodiment, the output of the logic circuitry is coupled to the hard-coded bit to cause the hard-coded bit to change in response to the output of the logic circuitry.

To change a tieoff cell, only one metal layer has to be changed. Making the hard-coded bit to be changeable by changing any one tieoff cell allows the hard-coded bit to be changeable in any single metal layer. Moreover, the hard-coded bit can be changed again later in another stepping without undoing the change made to a tieoff cell in an earlier stepping. If the functional change in a stepping requires changing more than one metal layer, then a tieoff cell chosen from any one of those metal layers can be changed to change the hard-coded bit.

The foregoing discussion merely describes some exemplary embodiments of the present invention. One skilled in the art will readily recognize from such discussion, the accompanying drawings and the claims that various modifications can be made without departing from the spirit and scope of the appended claims. The description is thus to be regarded as illustrative instead of limiting.

What is claimed is:

1. An integrated circuit comprising:
   a plurality of metal layers;
   a logic circuit having a plurality of input terminals and an output terminal to output a hard-coded bit, wherein a value of the hard-coded bit is changeable during fabrication in any single one of the plurality of metal layers; and
   a plurality of cells, each of the plurality of cells being on a distinct one of the plurality of metal layers, each of the plurality of cells comprising an output pin coupled to one of the plurality of input terminals of the logic circuit, each of the plurality of cells further comprising a connector to electrically couple the output pin to one of a first via stack and a second via stack, wherein the first via stack and the second via stack are electrically coupled to a first supply voltage and a second supply voltage, respectively.

2. The integrated circuit of claim 1, wherein the logic circuit comprises an exclusive OR ("XOR") circuit.

3. The integrated circuit of claim 1, wherein the hard-coded bit is part of a revision identifier.

4. The integrated circuit of claim 1, wherein the hard-coded bit is a feature selection bit.

* * * * *